United States Patent [19]

Oh

[11] Patent Number: 5,893,508
[45] Date of Patent: Apr. 13, 1999

[54] CIRCUIT BOARD HAVING A TERMINAL FOR DETECTING DISCONNECTION OF A BONDING WIRE AND A WIRE BONDING APPARATUS USING SUCH A BOARD

[75] Inventor: Seh Hyuk Oh, Cheonan, Rep. of Korea

[73] Assignee: Samsung Electronics Co., Ltd., Suwon, Rep. of Korea

[21] Appl. No.: 08/774,608

[22] Filed: Dec. 30, 1996

[30] Foreign Application Priority Data

Dec. 30, 1995 [KR] Rep. of Korea ............... 95-68156

[51] Int. Cl.⁶ ............................... H01L 21/603
[52] U.S. Cl. ................. 228/4.5; 228/9; 228/44.7; 228/56.5
[58] Field of Search ............... 228/180.5, 212, 228/4.5, 9, 44.7, 56.5; 324/537

[56] References Cited

U.S. PATENT DOCUMENTS

| | | | |
|---|---|---|---|
| 3,734,382 | 5/1973 | Spanjer | 228/8 |
| 4,555,052 | 11/1985 | Kurtz et al. | 228/4.5 |
| 4,684,884 | 8/1987 | Soderlund | 324/537 |

*Primary Examiner*—Samuel M. Heinrich
*Attorney, Agent, or Firm*—Jones & Volentine, L.L.P.

[57] ABSTRACT

A circuit board for detecting disconnection of a bonding wire, includes a circuit board body; a pattern layer having a die pad region formed on an upper surface of the circuit board body for mounting a semiconductor chip thereon, and respective conductive wire patterns formed on the upper surface and an opposite lower surface of the circuit board body for electrically connecting the semiconductor chip; and via holes perforating through the circuit board body for connecting the conductive wire patterns. The pattern layer further includes bonding leads formed at one end of the conductive wire patterns and connected to the semiconductor chip by bonding wires for electrical connection between the semiconductor chip and the circuit board, and earth terminals formed outside of the die pad region and connected to a device for clamping the circuit board during electrical connection between the semiconductor chip and the circuit board by wire bonding. A detecting device detects a bonding wire disconnection by measuring an electrical resistance at the same time that the wire is bonded on a bonding pad of the semiconductor chip.

7 Claims, 4 Drawing Sheets

CIRCUIT BOARD HAVING A TERMINAL FOR DETECTING DISCONNECTION OF A BONDING WIRE AND A WIRE BONDING APPARATUS USING SUCH A BOARD

BACKGROUND OF THE INVENTION

1. Field of the Invention

The present invention relates generally to a semiconductor chip package, and in particular to a circuit board having earth terminals for detecting the disconnection of bonding wires during a wire bonding process and a wire bonding apparatus using such a circuit board.

2. Description of the Related Arts

Wire bonding is the most widely used technology for chip interconnection in the plastic chip assembly process. A semiconductor chip and a board are connected to each other with wires using thermo-compression bonding, ultrasonic bonding or thermo-sonic bonding processes. The thermo-sonic bonding and thermo-compression bonding processes comprise a ball-wedge bonding step using gold wires. The processes employ a capillary that is driven upon an application of an ultrasonic-wave during every wire bonding process to improve an adhesion force between the gold wires and the aluminum bonding pads.

FIG. 1 is a schematic view showing a conventional wire bonding process between a lead of a lead frame and a semiconductor chip. Referring to FIG. 1, bonding pads (23) of a board (21) are connected to bonding pads (34) of a semiconductor chip (33) by wires in a BGA (Ball Grid Array) package (20).

The BGA package (20) comprises the circuit board (21) and the semiconductor chip (33). The circuit board (21) is composed of BT resin(Bismaleimide Triazine resin) and has a conductive pattern layer (22). After the wire bonding process, chip (33) is encapsulated with a thermosetting molding resin to create a package body (not shown). A chip-mounting part (31) for mounting the semiconductor chip (33) by adhesives (32) thereon, and bonding pads (23) for wedge bonding are formed on the upper surface of the circuit board (21). Solder ball pads (24) for mounting a plurality of solder balls (28) are formed and attached to a bottom surface of the circuit board (21) opposite to the surface where the bonding pads (23) are formed. The whole bottom surface of the circuit board (21), except the solder ball pads (24), is covered with a solder resist (27) in order to increase adhesion between the solder balls (28) and the board (21). The bonding pads (23) are electrically connected to the solder ball pads (24) through signal via (25). Heat-emitting via (26) releases heat generated from semiconductor chip (33) to the outside of the package body.

After mounting the semiconductor chip (33) on the circuit board (21), dampers (30) hold and fix the board (21). The surface of the board (21) to be held by the damper is first covered with a protective layer (29). The positions of the bonding pads (34) of the chip (33) and the positions of the bonding pads (23) of the board (21) are recognized and aligned by the bonding head (10) using a CCD camera (not shown).

The bonding head (10) comprises a spool unit (18) wound by wire (15) for the bonding process, a capillary (12) and a torch electrode (16). When the switch (19) of the spool unit (18) is turned on, the wire (15) has constant tension and is connected to the capillary (12) through a transducer (14).

The wire bonding process comprises a first ball bonding step for the aluminum bonding pad (34) of the semiconductor chip (33), and a second wedge bonding step for the bonding pad (23) of the board (21). A ball is formed at the end of the wire (15) when a high voltage, for example, over 5,000 Volts, is instantaneously applied to the end of the wire (15) from the capillary (12) by torch electrode (16). As shown in FIG. 2, the first ball bonding step is performed on the aluminum bonding pad (34) by pressing and heating the wire ball (35) on the bonding pad (34), thereby bonding the wire ball (35) on the bonding pad (34) of the semiconductor chip (33). Adhesion between the two metals may be increased by applying ultrasonic power at the time of the bonding process.

After the first ball bonding step, the wire (38) is guided to the bonding pad (23) of the board (21) by the capillary (12) and then the second wedge bonding step is performed on the bonding pad (23) as shown in FIG. 2. After the second wedge bonding step, the rest of the wire is cut, thereby completing one wire bonding cycle. This wire bonding process is repeated for every bonding pad to be connected.

The wire bonding process as described above is essential to ensure that power is input to the semiconductor integrated circuit and information is output from the semiconductor integrated circuit to an external terminal. However, as semiconductor devices become denser and more integrated, the number of input/output terminals to be bonded increases, and the need for a more advanced bonding technique is evident. However, a good wire connection, performed by the bonding process, can be still only be detected by visual inspection and reliability tests. If there are errors in the wire bonding process or impurities on the aluminum bonding pads (34), the wire may be disconnected. This problem is compounded in the case of highly-integrated semiconductor devices, which may have numerous wire disconnections, and where it is impossible to detect these disconnections during the wire bonding process. As a result, substandard articles are produced.

SUMMARY OF THE INVENTION

Thus, the present invention is provided in order to overcome one or more of the conventional drawbacks as described above, and an object of the present invention is to provide an auto-detecting apparatus for bonding wire disconnections, which checks the bonding state of the wire after every bonding process.

Another object of the present invention is to provide a circuit board which allows for the detection of bonding wire disconnections during the wire bonding process, and a wire bonding apparatus using the same.

In order to accomplish these and other objectives, there is provided a circuit board for detecting disconnection of a bonding wire comprising a circuit board body; a pattern layer having a die pad region formed on an upper surface of the circuit board body for mounting a semiconductor chip thereon, and respective conductive wire patterns formed on the upper surface and an opposite lower surface of the circuit board body for electrically connecting the semiconductor chip; and via holes perforating through the circuit board body for connecting the conductive wire patterns. The pattern layer further includes bonding leads formed at one end of the conductive wire patterns and connected to the semiconductor chip by bonding wires for electrical connection between the semiconductor chip and the circuit board, and earth terminals formed outside of the die pad region and connected to a device for clamping the circuit board during electrical connection between the semiconductor chip and the circuit board by wire bonding.

In another aspect, there is provided a wire bonding apparatus comprising a clamping means connected to earth terminals of the circuit board; and a bonding head having a wire spool, a capillary and a means for detecting bonding wire disconnections by measuring an electric resistance at the same time that wire is bonded on the bonding pad of the semiconductor chip.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and in which.

DETAILED DESCRIPTION OF THE INVENTION

The present invention will now be described in more detail with reference to accompanying drawings.

Figure 1:
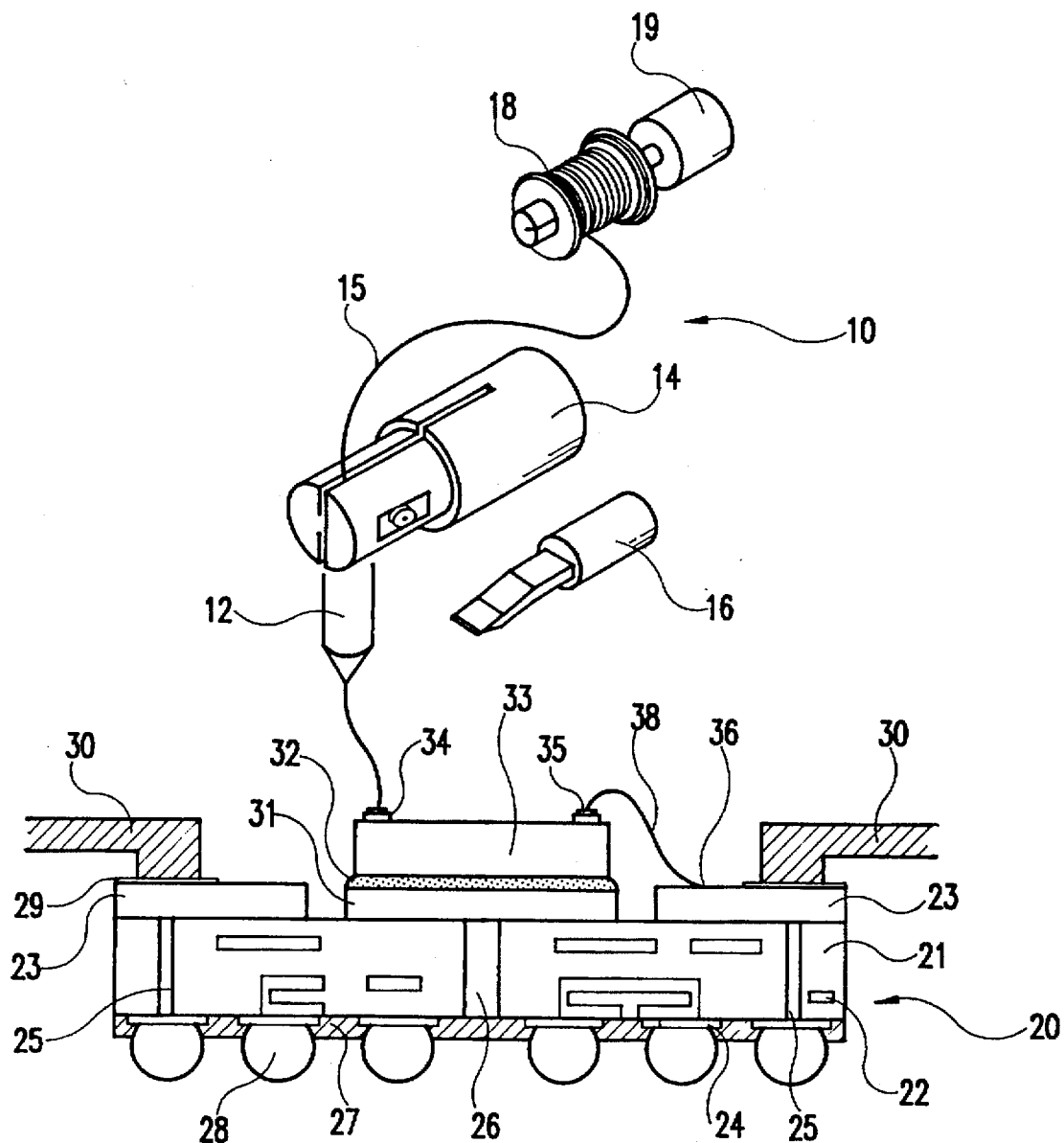
FIG. 1 is a schematic sectional view showing a conventional process for wire bonding between a semiconductor chip and a board in a ball grid array package.
Figure 2:
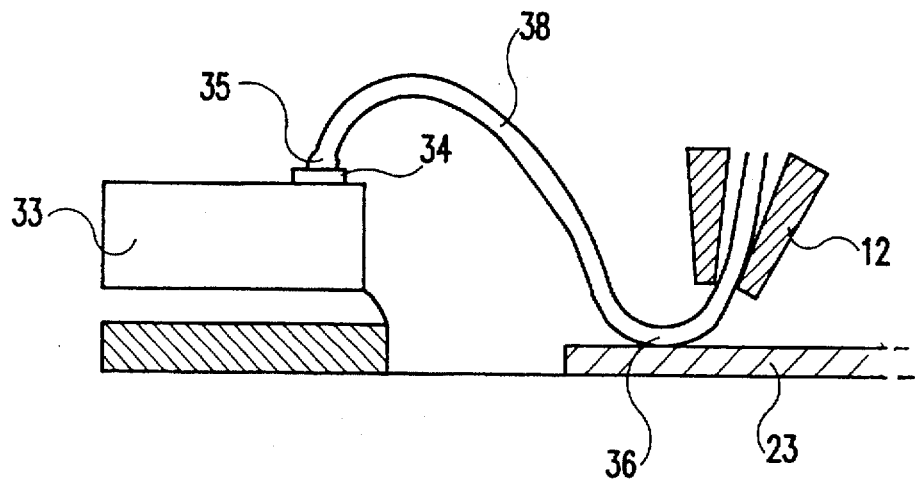
FIG. 2 is a partial detailed view showing the ball and wedge bonding in FIG. 1.
Figure 3:
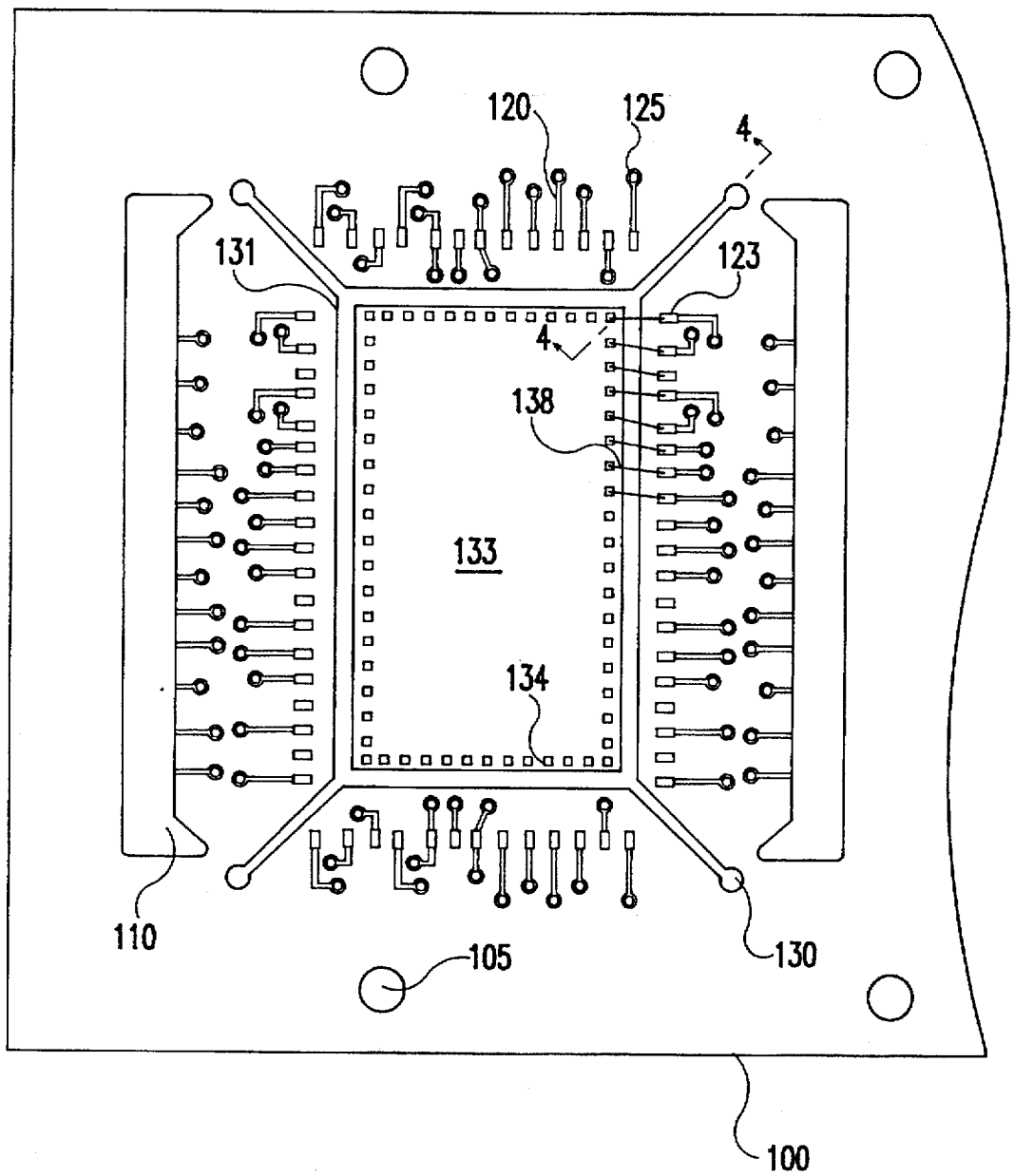
FIG. 3 is a plan view of a circuit board having earth terminals according to the present invention.

FIG. 3 is a plan view of a circuit board having earth terminals according to the present invention. The circuit board (100) is a printed circuit board (PCB or PWB) employed for the ball grid array package as shown in FIG. 1. The board (100) is made of BT resin formed by a rolling process. Openings (105) on the board (100) are sprocket holes that are used to transfer the board.

Copper (Cu) layers forming patterns (120, 123) are compressed and attached on both the upper surface and the opposite lower surface of the board (100). Via holes (125) that perforate through the board (100) are formed and electroplated by an evaporation process.

The Cu layer on the upper surface of the board (100) is etched selectively to form patterns such as die pads (131) for mounting a semiconductor chip (133) thereon, wire patterns (120), and bonding leads (123) formed at the ends of the wire patterns (120) and which are connected to bonding pads (134) of the semiconductor chip (133) by bonding wires. In addition, earth terminals (130) according to the present invention are formed by this patterning of the upper surface Cu layer. The earth terminals (130) are for detecting any disconnections of the bonding wires. A heating-emitting via for releasing heat generated from the semiconductor chip (133) may be formed on the die pad (131) as shown in FIG. 1.

A selective etching process comprises the steps of (1) covering the Cu layer with a layer of photoresist, (2) exposing and developing the photoresist layer with the photomask determined by a designated pattern as described above, and (3) etching the unnecessary part with an etching solution.

This etching process is also applied to the Cu layer on the opposite surface of the board (100). For ball grid array packages, the etching process forms wire patterns and solder ball pads for mounting solder balls thereon on the opposite surface of the board (100).

After the patterning of the Cu layers by the selective etching process, a solder resist is applied over the whole surface except the bonding leads (123), the earth terminals (130) and the die pads (131). The solder resist protects the semiconductor chip (133) and the wire patterns (120) and prevents the Cu pattern layers from being deformed or degraded during the packaging process.

The earth terminals (130) may have various shapes within the scope of the present invention, for example, a circle. If a circular shape is used, it is desirable that the diameter be equal to, or greater than, 1.5 mm.

Figure 4:
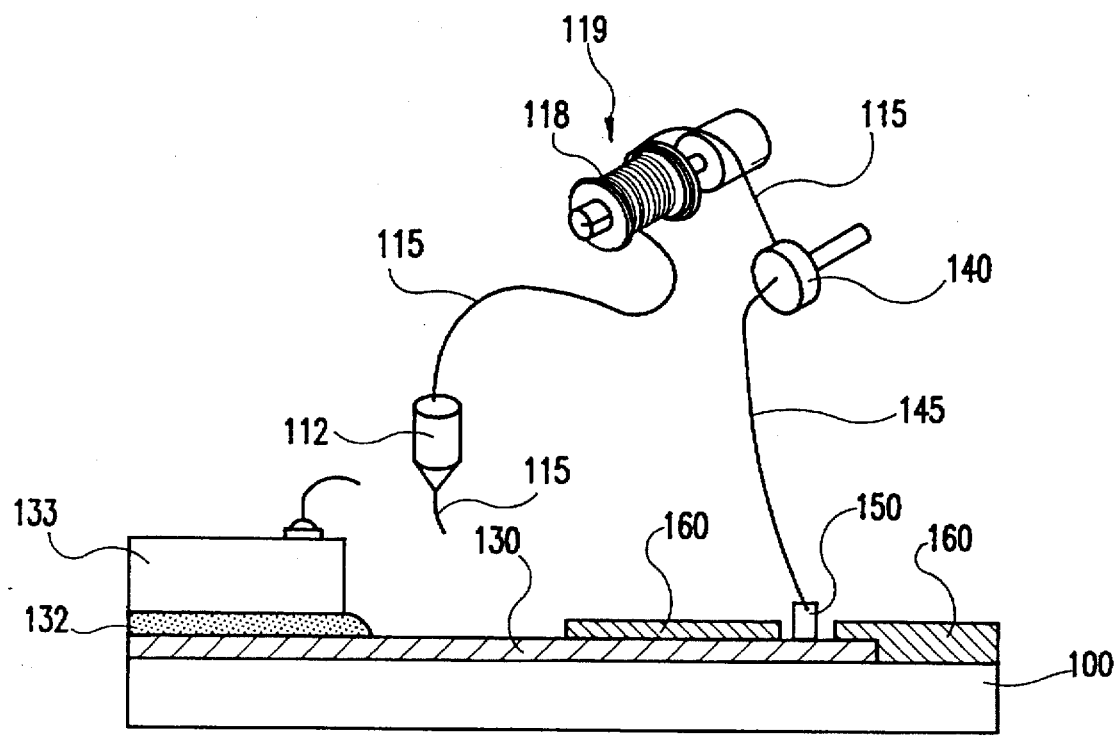
FIG. 4 is a sectional view taken along the line 4—4 of FIG. 3, which shows a wire bonding process for electrical connection between the circuit board having the earth terminals in FIG. 3 and the semiconductor chip.

FIG. 4 is a sectional view taken along the line 4—4 of FIG. 3 showing a wire bonding process for electrically connecting the circuit board (100) having the earth terminals (130) in FIG. 3 and the semiconductor chip (133).

A wire bonding apparatus according to the present invention comprises a damper (160) and a bonding head. The bonding head (119) comprises a wire spool (118) wound by gold wire or aluminum wire (115), a capillary (112), and a resistance gauge (140). The wire spool (118) is connected to one end of the resistance gauge (140). The damper (160) has an earth pin (150). This earth pin (150) is connected to the other end of the resistance gauge (140) and is in contact with the earth terminal (130) of the circuit board. The clamper (160) and the earth terminal (130) are connected to the resistance gauge (140) via the earth pin (150).

The circuit board (100) on which the semiconductor chip (133) is attached by an adhesive (132) is loaded on the wire bonding apparatus and then fixed by a clamper (160). After the connection between the earth pin (150) and the earth terminal (130) and the clamping of the circuit board (100) are completed, the wire bonding process between the semiconductor chip (133) and the circuit board (100) is performed by the capillary (112). At this time, a predetermined amount of power is applied to the resistance gauge (140) and the resistance is detected when the wire is attached to the bonding pad of the semiconductor chip. The apparatus, therefore, can readily determine the bonding state, that is whether the connection is good or bad, by detecting the resistance during the wire bonding process. When a bad connection is detected, the apparatus stops automatically by the operation of its internal system.

Figure 5:
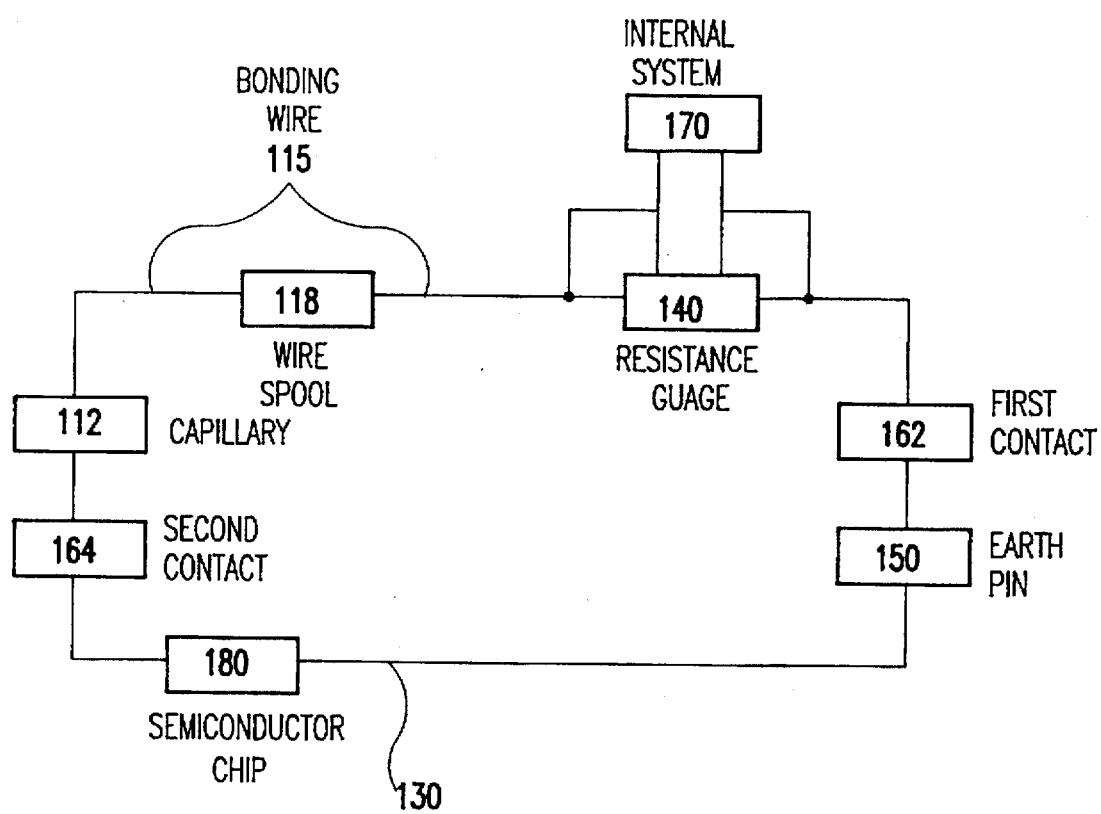
FIG. 5 is a circuit block diagram showing the connection between the bonding apparatus for detecting wire disconnections during the wire bonding process in FIG. 4 and the circuit board.

FIG. 5 is a circuit block diagram showing the electrical connection between the bonding head and the circuit board. The capillary (112), the wire spool (118) and the resistance gauge (140) are connected by the bonding wire (115). The resistance gauge (140) is also connected to the internal system (170) of the wire bonding apparatus, to the current source (not shown) for applying current to the wire (115) via the resistance gauge (140), and to the earth terminal (130) via the earth pin (150) of the damper (160).

After the connection between the earth pin (150) and the earth terminal (130) is completed, the bonding wire (115) from the capillary (112) is connected to the semiconductor chip (180) mounted on the die pad. At this time, power is applied through the resistance gauge (140) and the resistance is measured. If the resistance is higher than a predetermined value, the apparatus determines that the bonding state or bonding connection is bad and transmits a signal to the internal system (170), whereby the wire bonding process stops automatically. In other words, if the first contact (162)

and the second contact (164) are grounded, then the normal correct results are displayed on the resistance gauge (140). On the other hand, when either of the first (162) and second (164) contacts is open, this failure is displayed on the resistance gauge and corresponding electrical signals are sent to the internal system (170), and the wire bonding operation is stopped.

With the apparatus of the present, it is possible to detect the bonding state or bonding connection, whether good or bad, in real time during the wire bonding process, and thereby to increase the reliability of the wire bonding process and also the reliability of the semiconductor chip package.

Although preferred embodiments of the present invention have been described in detail hereinabove, it should be clearly understood that many variations and/or modifications of the basic inventive concepts herein taught, which may appear to those skilled in the art, will still fall within the spirit and scope of the present invention as defined in the appended claims and their equivalents.

What is claimed is:

1. A wire bonding apparatus for electrical connection between a semiconductor chip with a plurality of bonding pads and a circuit board comprising a die pad region for mounting said semiconductor chip thereon and conductive wire patterns, comprising:

a clamping means for clamping said circuit board;

a bonding head having a wire spool wound by a wire; and a capillary connected to said wire spool for bonding wires on said bonding pads of said semiconductor chip and on said conductive wire patterns, said circuit board further comprising earth terminals which are connected to said clamping means and to which power is applied, and said bonding head further comprising a means for detecting a bonding wire disconnection by measuring an electrical resistance at the same time that said wire is bonded on said bonding pad of said semiconductor chip.

2. The wire bonding apparatus of claim 1, wherein said detecting means comprises a resistance gauge simultaneously connected to said wire spool, to said earth terminal of said circuit board, and to an internal system of said wire bonding apparatus.

3. The wire bonding apparatus of claim 1, wherein said bonding head performs respective ball and wedge bonding processes between said bonding pad of said semiconductor chip and said wire pattern of said circuit board.

4. The wire bonding apparatus of claim 2, wherein said bonding head performs respective ball and wedge bonding processes between said bonding pad of said semiconductor chip and said wire pattern of said circuit board.

5. The wire bonding apparatus of claim 2, wherein said detecting means is for measuring the electrical resistance between said wire and said bonding pad at the same time that said wire is bonded on said bonding pad of said semiconductor chip.

6. The wire bonding apparatus of claim 2, wherein said detecting means stops said bonding head by an action of said internal system of said wire bonding apparatus when the electrical resistance is higher than a predetermined value.

7. The wire bonding apparatus of claim 5, wherein said detecting means stops said bonding head by an action of said internal system of said wire bonding apparatus when the electrical resistance is higher than a predetermined value.

* * * * *